United States Patent [19]
Wilson et al.

[11] Patent Number: 5,614,856
[45] Date of Patent: Mar. 25, 1997

[54] WAVESHAPING CIRCUIT GENERATING TWO RISING SLOPES FOR A SENSE AMPLIFIER PULLDOWN DEVICE

[75] Inventors: Alan J. Wilson, Nampa; Russell J. Baker, Meridian; Aaron Schoenfeld, Boise, all of Id.

[73] Assignee: Micron Technology, Inc., Boise, Id.

[21] Appl. No.: 613,681

[22] Filed: Mar. 11, 1996

[51] Int. Cl.[6] .................................... H03K 5/12
[52] U.S. Cl. .......................... 327/170; 327/404
[58] Field of Search ...................... 327/170, 134, 327/379–383, 403, 404, 263, 264, 268, 51, 52, 55

[56] References Cited

U.S. PATENT DOCUMENTS

| | | | |
|---|---|---|---|
| 4,571,504 | 2/1986 | Iwamoto et al. | 327/404 |
| 5,042,011 | 8/1991 | Casper et al. | 365/205 |
| 5,063,313 | 11/1991 | Kikuda et al. | 327/170 |
| 5,113,372 | 5/1992 | Johnson | 365/205 |
| 5,132,575 | 7/1992 | Chern | 307/530 |
| 5,220,221 | 6/1993 | Casper | 307/530 |
| 5,245,578 | 9/1993 | McLaury | 365/203 |
| 5,280,205 | 6/1994 | Green et al. | 307/530 |
| 5,302,870 | 4/1994 | Chern | 307/530 |
| 5,305,263 | 4/1994 | Morgan | 365/190 |
| 5,315,187 | 5/1994 | Cheng | 327/379 |
| 5,367,213 | 11/1994 | Casper | 327/56 |
| 5,369,622 | 11/1994 | McLaury | 365/233 |

*Primary Examiner*—Toan Tran
*Attorney, Agent, or Firm*—Schwegman, Lundberg, Woessner & Kluth, P.A.

[57] ABSTRACT

A waveshaping circuit for a sense amplifier pulldown device receives a standard digital signal at its input and independently creates a signal with two distinct rising slopes at its output. This unique output signal activates the sense amplifier pulldown device slowly at first with the first rising slope then quickly saturates it with the second rising slope allowing the sense amplifier to accurately sense and amplify the voltage difference between two digit lines.

9 Claims, 3 Drawing Sheets

WAVESHAPING CIRCUIT GENERATING TWO RISING SLOPES FOR A SENSE AMPLIFIER PULLDOWN DEVICE

THE FIELD OF THE INVENTION

The present invention relates generally to semiconductor integrated circuits and in particular the present invention relates to a waveshaping circuit for a sense amplifier pulldown device used in integrated circuit memories.

BACKGROUND OF THE INVENTION

Dynamic integrated circuit memory such as a random access memory (DRAM) traditionally stores data as a charge on memory cells. Each memory cell comprises a capacitor capable of holding a charge and a transistor for accessing the capacitor charge. The charge is referred to as a data bit and can be either a high voltage or a low voltage. Data can be stored in the memory cells during a write mode, and data may be retrieved from memory cells during a read mode. Data is transferred internally on signal lines which are commonly referred to as bit or digit lines. A typical DRAM is designed to have pairs of digit lines coupled to the memory cells, a single pair is commonly referred to as DIGIT and DIGIT*. The memory cell capacitors are charged or discharged through access transistors which are activated by other signal lines or word lines.

The capacitance of each memory cell in an integrated circuit is very small due to the small size of capacitors used to obtain a dense population of memory cells. Therefore, the available charge is proportionally small for each memory cell. For a reliable read of the memory cell capacitor charge, the charge must be sensed and amplified. A sense amplifier is essentially a differential amplifier designed to perform the sense and amplify operation.

The sense and amplify operation involves the detection and amplification of charge or the absence thereof in the memory cell capacitor. When a word line coupled to a cell access transistor transitions to a voltage that is at least one threshold voltage (Vt) above VEQ, which is also the initial value VEQ of both DIGIT and DIGIT*, the cell capacitor is discharged onto the digit line (cell-to-DIGIT) provided that the cell capacitor is initially charged. Otherwise if the cell capacitor had no charge initially then it will be charged (DIGIT-to-cell). In either case, cell-to-DIGIT discharge or DIGIT-to-cell charge, a differential voltage (dV) occurs between DIGIT and DIGIT*.

There are several different designs and implementations of sense amplifiers available. In one design disclosed in U.S. Pat. No. 5,042,011 to Casper, a sense amplifier comprises a pair of cross-coupled transistors and a single switched pulldown transistor device designed to turn the sense amplifier on by pulling down the common node of the sense amplifier's transistors to a reference potential voltage (VREF). In the case of cell-to-DIGIT discharge, DIGIT voltage VEQ is slightly increased to VEQ+dV while DIGIT* remains at VEQ resulting in DIGIT having a higher voltage than DIGIT*. When the pulldown device is activated, the sense amplifier gated by DIGIT will turn on faster than the sense amplifier gated by DIGIT*. Consequently, the transistor gated by DIGIT pulls DIGIT* from VEQ to VREF, while DIGIT remains at approximately VEQ+dV. Similarly, in the case of DIGIT-to-cell discharge, DIGIT is slightly decreased to VEQ-dV, while DIGIT* remains at VEQ. Therefore when the pulldown device is activated, DIGIT will be pulled down to VREF, while DIGIT* remains approximately at VEQ.

The pulldown device discussed above is driven by a pulldown driver consisting of a CMOS inverter. In use, when triggered by the output signal of the CMOS inverter, the pulldown device is turned on slowly, then quickly enters into saturation. Consequently, the sense amplifier common node is pulled down slowly, then quickly. The pulldown device needs to be pulled down quickly so the sense amplifier can perform the read of memory cell faster resulting in a faster speed of the DRAM. However, if the pulldown is too quick, the capacitive coupling between the sources and drains of the sense amplifier transistors tends to pull both DIGIT and DIGIT* down before the common node is pulled down low enough to turn on only one of the transistors. In this case when both of the transistors are turned on, it shorts out its capacitive coupling and bounces both DIGIT and DIGIT* and thus undesirable noise occurs. Therefore the slow-quick switching method is needed to pull down the common node of the sense amplifier. To achieve this slow-quick switching method, the pulldown device must receive a signal with a slow rising edge at the output of the pulldown driver. The CMOS inverter of the pulldown driver was designed to achieved this technique. To do so, the CMOS inverter must have a p-to-n transistor size ratio of about 0.8 to create a slow rising edge. Also, the input signal to the input of the CMOS inverter must be a slow high-to-low edge rate.

There is a need for an improved design for the pulldown driver.

SUMMARY OF THE INVENTION

The present invention is a pulldown driver or a waveshaping circuit for a sense amplifier pulldown device. The waveshaping circuit receives a standard digital signal at its input and independently creates a signal with two distinct rising slopes at its output. This output signal turns the pulldown on slowly, then quickly so that the sense amplifier can accurately detect the difference in voltages on DIGIT and DIGIT*.

In a preferred embodiment, the waveshaping circuit comprises an input for receiving an input signal and output for providing an output signal. A pair of field effect transistors with their gates coupled between two series connected inverters are designed to create two different voltage dividers and RC networks to produce two distinct rising slopes at the output. The resistance of the inverters and the gate capacitance of the pulldown device form an RC network. The transistors are different in size thus altering the voltage divider, consequently, changing the charge time of the gate capacitance. This results in the RC network providing two distinct rising slopes at the output signal.

DETAILED DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is therefore, not to be taken in limiting sense, and the scope of the invention is defined by the appended claims.

Figure 1:
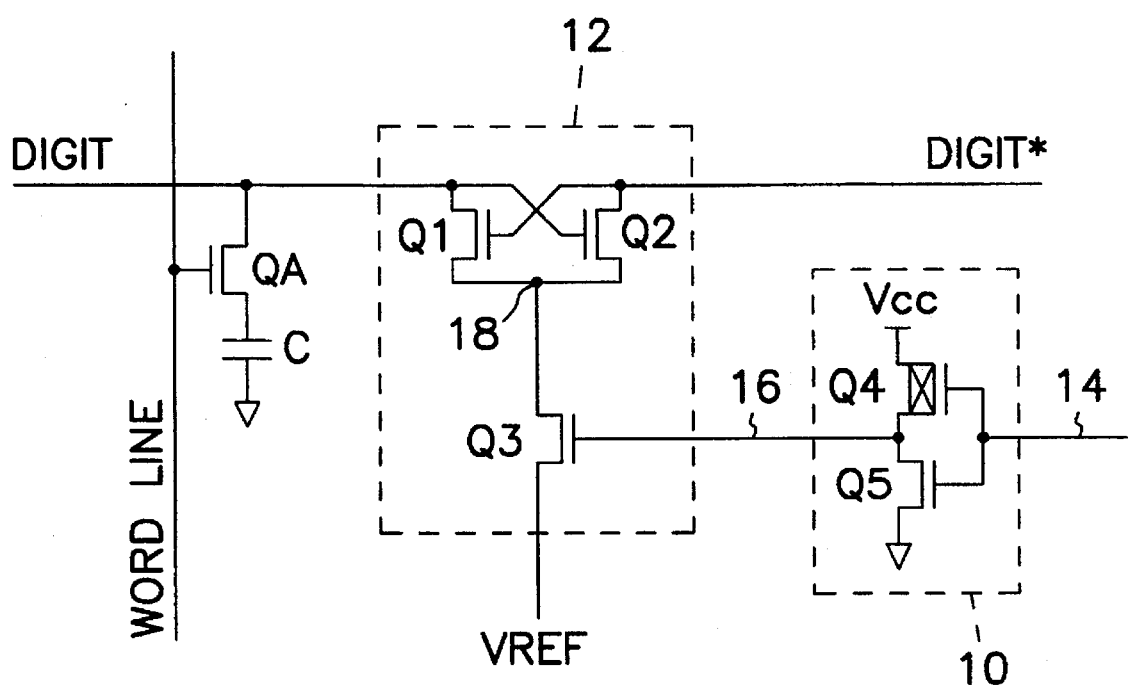
FIG. 1 is a prior art of a sense amplifier and a pulldown driver associated with a memory cell.

FIG. 1 illustrates a prior art n-sense amplifier enclosed in broken line 12 having pulldown transistor Q3 coupled to pulldown driver enclosed in broken line 10 for a typical dynamic random access memory (DRAM) cell having an access transistor QA coupled between a word line, a digit line (DIGIT) and a storage capacitor C. N-sense amplifier 12 comprises a pair of cross-coupled n-channel transistors Q1 and Q2 with the gate of each coupled to the other's drain and their sources are connected together at common node 18. The gates of transistors Q1 and Q2 are coupled to DIGIT* and DIGIT respectively. Sense amplifier 12 also comprises a pulldown transistor Q3 with its source coupled to a reference voltage VREF, its drain coupled to a common node 18 and its gate coupled to an output 16 of pulldown driver 10. Pulldown driver 10 is a CMOS inverter having a p-channel transistor Q4 and an n-channel transistor Q5 with their drains coupled together at output 16 and their gates coupled together at an input 14. P-channel transistor Q4 is relatively weaker than n-channel transistor Q5 with a size Q4/Q5 ratio of about 0.8.

In operation, assume that capacitor C contains a charge and DIGIT and DIGIT* both have the same initial voltage of VEQ. When the word line is switched from a low to high transition, capacitor C is discharged onto DIGIT through access transistor QA causing a slight increase in DIGIT voltage while DIGIT* voltage is unchanged at VEQ. At this point, DIGIT has a voltage of VEQ+dV, where dV is the increased voltage. Input 14 of pulldown driver 10 then undergoes a high to low transition, causing output 16 to begin to have a rising edge and consequently turn on pulldown Q3. At this point, pulldown Q3 is turned on slowly by the slow rising edge of output 16 because of the 0.8 size ratio of CMOS inverter of pulldown driver 10. Since pulldown Q3 turns on slowly, only the sense amplifier transistor Q2 turns on resulting in a more accurate pulldown of DIGIT*. In this case, with an initially charged capacitor C, DIGIT* will be pulled from VEQ to VREF while DIGIT remains approximately at VEQ+dV. When capacitor C initially contains no charge, DIGIT* remains the same at approximately VEQ while DIGIT is pulled from VEQ−dV to VREF.

Figure 2:
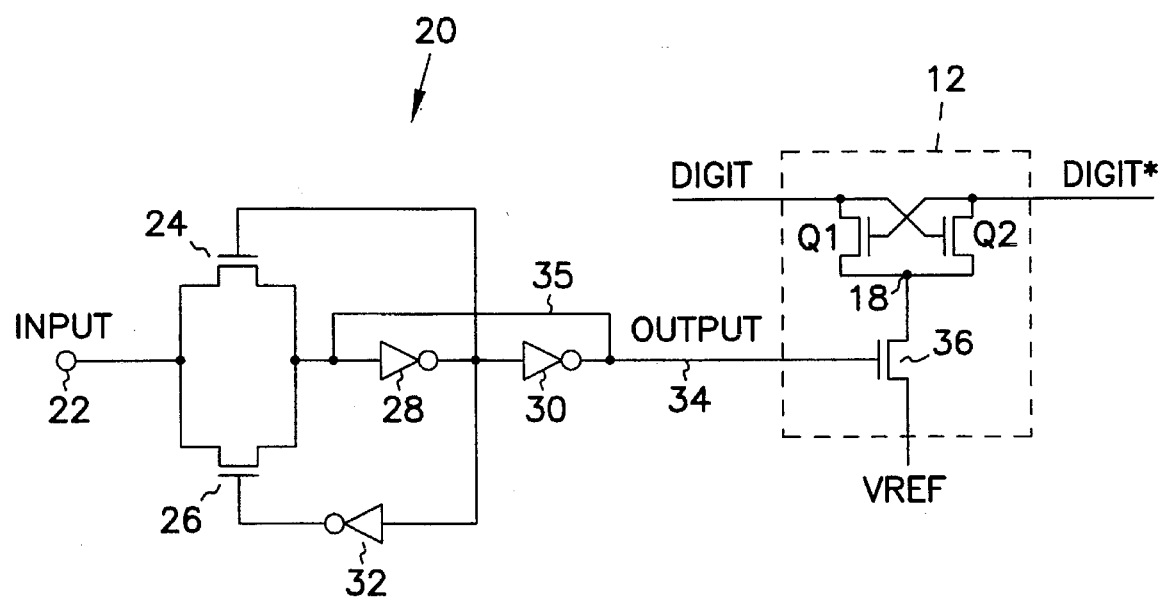
FIG. 2 is a schematic diagram describing a waveshaping circuit according to the invention.

FIG. 2 describes an improved pulldown driver in the form of a waveshaping circuit for a sense amplifier pulldown device. In one embodiment, a waveshaping circuit indicated generally at 20 comprises an input 22 for receiving an incoming input signal and an output 34 for providing an output signal. Waveshaping circuit 20 also comprises a pair of field effect transistors 24 and 26 having their drains coupled to input 22 and their sources coupled to output 34 via a conductive line 35. An inverter 28 has its input coupled to output 34 and its output coupled to the input of a second inverter 30 and the gate of transistor 24. The output of inverter 30 is also the output 34 of waveshaping circuit 20. The gate of transistor 26 is coupled to the output of inverter 32 whose input is coupled to the output of inverter 28. Transistors 24 and 26 are designed as a control device to monitor the voltage and to serve as a method for altering the slope of the signal at output 34. Inverter 28 is designed as a switch for changing the slope of the signal at output 34. Inverter 30 is designed as a delay device.

In operation, waveshaping circuit 20 receives an incoming signal at input 22 and provides an output signal with two distinct rising slopes (dual rising edge) at output 34. This dual rising edge output provides a unique signal required to drive pulldown device 36 of sense amplifier 12.

Figure 3A:
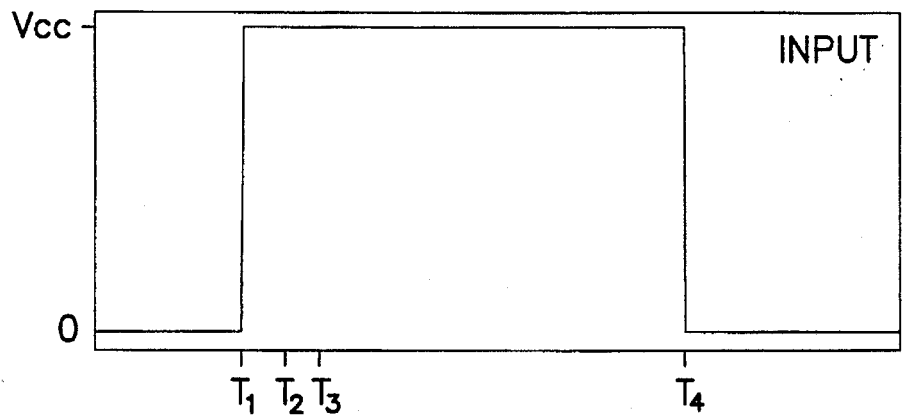
FIG. 3A–3C are timing diagrams illustrating the operation of the waveshaping circuit of FIG. 2.
Figure 3B:
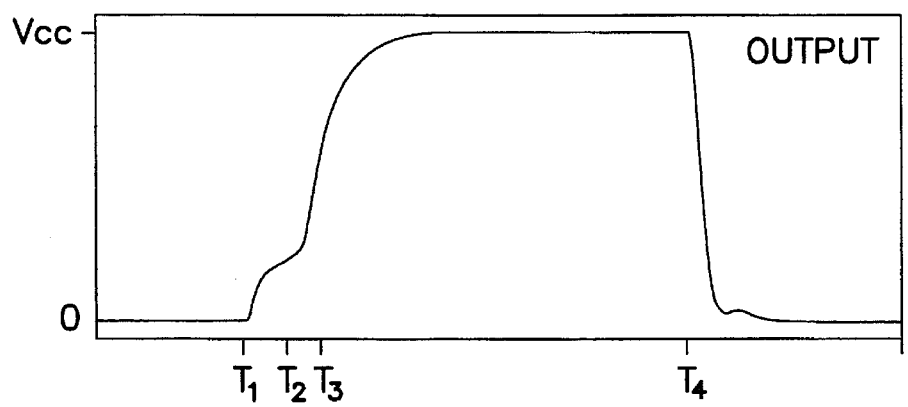
Figure 3C:
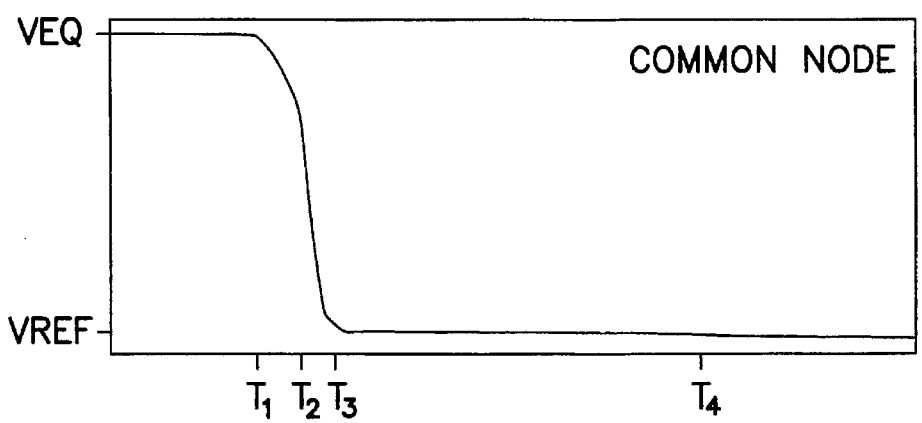

Timing diagrams in FIGS. 3A–3C further illustrate the operation of waveshaping circuit 20 of FIG. 2. FIG. 3A shows a positive going pulse applied at input 22. FIG. 3B shows the dual rising edge pulse at output 34. And FIG. 3C shows the signal at the common node 18 of the sense amplifier 12 of FIG. 2.

Referring to FIG. 2 and FIGS. 3A–3C, a standard positive going input signal or pulse, as shown in FIG. 3A, is applied at input 22 at time $T_1$, with transistor 26 initially off and transistor 24 initially on. This input signal sees a voltage divider between transistor 24 and the resistance of the n-channel device of inverter 30. The resistance of inverter 30 and the gate capacitance of pulldown device 36, and inverter 28 form an RC network. This RC network produces a first rising slope at output 34, which turns on pulldown device 36 slowly. Up to a point, when the output 34 reaches the switching or trip point of inverter 28, transistor 24 is turned off and transistor 26 is turned on. Transistor 26 can be sized larger than transistor 24 such that the original voltage divider is changed and decreases the charge time of the gate capacitances of pulldown device 36 and inverter 28. At this point the signal at output 34 starts to have a second rising slope at time $T_2$. Also, inverter 30 undergoes a low to high transition and that also supplies current to charge the gate capacitance and thus pull the output signal at time $T_3$ up to a high voltage level that quickly pulls down common node 18. When the input pulse undergoes a high to low transition at time $T_4$, and due to the low resistance of transistor 26, output 34 immediately drops to a low potential and shuts off pulldown device 36.

From a design perspective, to construct the waveshaping circuit described, device parameters are varied as desired. The point at which the slope changes can be determined by the sizing of the p-channel device of inverter 28. The first slope is determined by the resistance of the n-channel device of inverter 30 and transistor 24. The second slope is determined by the resistance of the p-channel device of inverter 28 and the sizing of transistor 26.

It should be noted that in many field effect transistors, the source and drain are essentially interchangeable, and interconnections specified herein should not be interpreted as solely limited to those described. In addition, certain transistors and devices were described as n-channel or p-channel transistors or devices. It is recognized by those skilled in the art that such transistors or devices may be switched on essentially a wholesale basis so that those described as p-channel become n-channel and those described as n-channel become p-channel transistors or devices without departing from scope and spirit of the present invention. This circuit could be modified to pull up a common node of a p-sense amplifier through a pullup device.

It is to be understood that the above description is intended to be illustrative, and not restrictive. Many other embodiments will be apparent to those of skill in the art upon reviewing the above description. The scope of the invention should, therefore, be determined with reference to appended claims, along with the full scope of equivalents to which such claims are entitled.

What is claimed is:

1. A waveshaping circuit for a sense amplifier comprising:
   a first transistor having a gate, a source and a drain;
   a second transistor having a gate, a source and a drain, wherein the drains of the first and second transistors are coupled to a first input to receive an input signal of the waveshaping circuit and the sources of the first and second transistors are coupled to a first output;
   a switching device having a second input coupled to the first output and the switching device having a second output coupled to the gate of the first transistor and a compliment of the second output coupled to the gate of the second transistor; and
   a delay device having a third input coupled to the gate of the first transistor and the delay device having a third output coupled to the first output to generate an output signal of the waveshaping circuit.

2. The waveshaping circuit of claim 1 wherein the size of the second transistor is larger than the size of the first transistor.

3. The waveshaping circuit of claim 2 wherein the switching device comprises an inverter having an inverter output coupled to the gate of the first transistor and a compliment of the inverter output coupled to the gate of the second transistor and an inverter input coupled to the first output.

4. The waveshaping circuit of claim 3 wherein the delay device comprises:
   an inverter having an inverter input coupled to the gate of the first transistor and an inverter output coupled to the third output; and
   a pulldown device coupled to the output of the inverter for providing a capacitive load.

5. The waveshaping circuit of claim 4 wherein the pulldown device comprises a sense amplifier circuit coupled to a memory device.

6. A waveshaping circuit having an input and an output coupled to a sense amplifier, wherein the waveshaping circuit comprising:
   a first transistor having a gate, a source and a drain;
   a second transistor having a gate, a source and a drain, wherein the drains of the first and second transistors are coupled to the input and the sources of the first and second transistors are coupled to the output;
   a first inverter having an input coupled to the waveshaping circuit output, and an output coupled to the gate of the first transistor;
   a second inverter having an input coupled to the output of the first inverter, and an output coupled to the waveshaping circuit output; and
   a third inverter having an input coupled to the output of the first inverter and an output coupled to the gate of the second transistor.

7. The waveshaping circuit of claim 6 wherein the size of the second transistor is larger than the size of the first transistor.

8. The waveshaping circuit in claim 7, wherein the first inverter has a p-channel device and an n-channel device, the p-channel device having a relatively longer channel length with respect to the n-channel device.

9. The waveshaping circuit in claim 8, wherein the second inverter has an n-channel device and a p-channel device, the n-channel device having a relatively longer channel length with respect to the p-channel device.

* * * * *